United States Patent
Nishimura et al.

[11] Patent Number: 6,091,183
[45] Date of Patent: Jul. 18, 2000

[54] PIEZOELECTRIC ELEMENT AND METHOD FOR DRIVING THE SAME

[75] Inventors: Tetsuhiko Nishimura, Zama; Junji Sato, Odawara; Hitoshi Aihara, Odawara; Takashi Ichihara, Odawara; Takashi Akiba, Odawara, all of Japan

[73] Assignee: Kasei Optonix, Ltd., Tokyo, Japan

[21] Appl. No.: 08/952,978

[22] PCT Filed: Jun. 5, 1996

[86] PCT No.: PCT/JP96/01516

§ 371 Date: Dec. 8, 1997

§ 102(e) Date: Dec. 8, 1997

[87] PCT Pub. No.: WO96/39722

PCT Pub. Date: Dec. 12, 1996

[30] Foreign Application Priority Data

Jun. 6, 1995 [JP] Japan ................................. 7-139486

[51] Int. Cl.[7] .................................................. H01L 41/08
[52] U.S. Cl. ............................................................ 310/358
[58] Field of Search ................................. 310/357–359, 310/311; 252/62.9

[56] References Cited

U.S. PATENT DOCUMENTS

| | | | |
|---|---|---|---|
| 4,977,547 | 12/1990 | Giniewicz et al. | 310/358 X |
| 5,221,872 | 6/1993 | Nishida et al. | 310/358 |
| 5,239,518 | 8/1993 | Kazmar | 310/315 X |
| 5,295,487 | 3/1994 | Saitoh et al. | 310/358 X |
| 5,729,262 | 3/1998 | Akiyama et al. | 310/358 X |

FOREIGN PATENT DOCUMENTS 62-274502  11/1987  Japan .

*Primary Examiner*—Mark O. Budd
*Attorney, Agent, or Firm*—Oblon, Spivak, McClelland, Maier & Neustadt, P.C.

[57] ABSTRACT

A piezoelectric element characterized by comprising a piezoelectric crystal which has a crystal structure around the crystal phase boundary of tetragonal and rhombohedral (MPB) in a specific temperature range and at least most of which phase-transits to tetragonal when heated to a temperature range higher than the above specific temperature range, and a method for driving the piezoelectric element in a temperature range not lower than the above specific temperature range.

8 Claims, 8 Drawing Sheets

PIEZOELECTRIC ELEMENT AND METHOD FOR DRIVING THE SAME

TECHNICAL FIELD

The present invention relates to a piezoelectric element and a method for driving the same. In more details, the present invention relates to a piezoelectric element wherein piezoelectric properties such as a dielectric constant, a piezoelectric strain constant and a mechanical displacement caused by application of an electric field are less dependent on temperature and are excellent in resistance to temperature, and a method for driving the same, particularly to a piezoelectric element which is suitable for applying a high electric field, such as an ultrasonic vibrator, an ultrasonic inspector, a medical ultrasonic probe, a fish finder or a piezoelectric actuator, and a method for driving the same.

TECHNICAL BACKGROUND

Heretofore, a piezoelectric element has been used for an ignition element, an ultrasonic vibrator, an ultrasonic inspector, a medical ultrasonic probe, a fish finder, a frequency filter, an acoustic element, a piezoelectric actuator, or the like. The ultrasonic vibrator is a device which drives or vibrates a piezoelectric element by an electric field having a high frequency in an ultrasonic range, such as an ultrasonic motor or a washing vibrator.

The ultrasonic inspector transmits an ultrasonic vibration obtained in the same manner as the ultrasonic vibrator to a material to be inspected, such as an iron plate, to find defects such as cracks in the inspected material from information of echoes reflected back from the cracks.

By applying the same principle to organisms, the medical ultrasonic probe inspects tissues of humans.

The fish finder transmits an ultrasonic wave into water to search fish by using information reflected back from fishes.

The actuator accurately shows microscopic displacements in orders of micrometers or under micrometers by applying a voltage, and application to sounds like buzzers, precise control of a flow rate of a pump, a valve or the like, autotracking of a VTR head, autofocus, an equipment to accurately determine a placement of a mechanical cutting tool in a range of micrometers, an equipment for producing a semiconductor to determine a microscopic displacement, or the like, has been rapidly developed these days.

As a material for these piezoelectric elements, a PZT ($PbZr_xTi_yO_3$:x+y=1,x≧0,y≧0)type material which contains lead, zirconium, titanium or the like and is an $ABO_3$ type perovskite compound having a divalent ion of lead or the like on the A site and a tetravalent ion of Zr, Ti or the like on the B site, is generally used. Specifically, a solid solution of the above PZT and a complex perovskite compound wherein the B site is on the average tetravalent, such as $Pb(Ni_{1/2}W_{1/2})O_3$, $Pb(Co_{1/3}Ni_{2/3})O_3$, $Pb(Ni_{1/3}Nb_{2/3})O_3$ or the like, is already known.

The piezoelectric material is selected by searching a composition wherein a dielectric constant, an electromechanical coupling constant, a piezoelectric strain constant or a mechanical displacement caused by inducing an electric field is large.

It is clarified that the dielectric constant, the electromechanical coupling constant, the piezoelectric strain constant or the mechanical displacement caused by inducing an electric field generally indicates a maximum value when the above PZT type compound is in a state around a crystal phase boundary of a rhombohedral and a tetragonal (this is referred to as morphotropic phase boundary, and will be simply referred to as [MPB] hereinafter), and the material is developed by searching the MPB.

For example, as a result of crystal phase identification by an X-ray diffraction measurement, it is crystallographically clarified that a crystal system of a pure PZT near room temperature is tetragonal when a ratio of constitutive elements on the B site of a perovskite structure, i.e. a molar ratio of Zr/Ti is at least 0/1 and is less than 0.53/0.47, that it is rhombohedral when Zr/Ti exceeds 0.53/0.47 and is at most 0.90/0.10, and that a crystal phase boundary of tetragonal/rhombohedral, i.e. MPB exists around Zr/Ti= 0.53/0.47. Further, it is known that the piezoelectric properties such as a dielectric constant, an electromechanical coupling constant and a piezoelectric strain constant become maximum around the MPB composition.

Heretofore, the piezoelectric element has been used around room temperature (for example, 10–30° C.), and therefore it has been sufficient to search a composition having excellent properties such as a large dielectric constant, a large electromechanical coupling constant, a large piezoelectric strain constant and a large displacement caused by inducing an electric field in such a temperature range. Accordingly, a method for driving a piezoelectric element suitable for use in a wide temperature range, has not been developed yet.

However, when the temperature range to be used is wide such as from room temperature to 100° C. or to a higher temperature (for example, 150° C.), from −50° C. to room temperature, or from −50° C. to 100° C. or to a higher temperature (for example, 150° C.), a displacement caused by inducing an electric field is as follows. A displacement amount caused by a voltage applied around room temperature remarkably changes with temperature. Accordingly, the displacement amount is remarkably small in a low temperature range, and on the contrary, the displacement amount remarkably increases in a high temperature range. Therefore, it was difficult to obtain a desired displacement in the whole range of temperature to be used.

Accordingly, to stably obtain a desired certain displacement in a wide temperature range, a method to change a voltage to be applied depending on driving temperatures, for example, application of a high voltage in a low temperature range and application of a low voltage in a high temperature range, is considered, but an expensive driving device is necessary therefor.

Next, a resistance related to difficulty of depolarization under an electric field in a direction opposite to polarization of a piezoelectric material, is explained. FIG. 1 explains electric coercive field which is a measure for easiness of changing a polarized state, and shows a relation between polarization (D) and an electric field (E) of a piezoelectric material. As clear from FIG. 1, when to a polarizated piezoelectric material {state(0)}, an electric field in a direction opposite to the polarization direction is applied, an intensity of polarization of the piezoelectric material decreases. This is because the direction changes to the opposite direction, i.e. to the direction of the electric field thus applied, and depolarization occurs. When the electric field in the opposite direction is remarkably intensified, the polarization in the opposite direction is saturated via {state (1)} to be in {state(2)} (see FIG. 1). During it, there is a state when an intensity of polarization of the piezoelectric material become 0, and in this state, the polarization of the piezoelectric material is directed in various directions to cause the state polarization=1. Such an intensity of an electric field when polarization become 0 (Ec) is electric coercive field. A material having a large electric coercive field is resistant to an electric field in a direction opposite to a polarization treatment, and is difficult to be depolarized.

Generally, a material to be used for a piezoelectric actuator an ultrasonic inspector, a medical probe or the like is what is called a soft type material, and therefore, the above electric coercive field is small and the electric coercive field becomes much smaller at a high temperature. Accordingly, when it is driven at a high temperature such as over 80° C., there were problems in durability of displacement as follows. That is, when it is maintained at a high temperature for a long time in a state wherein no voltage is applied, it is depolarized, or when an electric field in a direction opposite to polarization is applied, the piezoelectric element becomes to be depolarized more easily.

A dielectric constant of a piezoelectric element generally increases with temperature. When a piezoelectric material is driven alternately in the electric field, the dielectric constant becomes higher because of a higher temperature. Therefore, dielectric loss increases, it becomes to generate heat more easily, and it is depolarized. That is, these problems in durability existed.

An object of the present invention is to solve the above problems, to have a displacement or a dielectric constant of a piezoelectric element less dependent on temperature, and to provide a piezoelectric element wherein decrease of electric coercive field at a high temperature is suppressed and a method for a driving same.

DISCLOSURE OF THE INVENTION

To solve the problem of the conventional piezoelectric material in temperature dependency of dielectric constant, a displacement and an electric coercive field, the present inventors have studied a piezoelectric material and a method for driving the same. As a result, among PZT type ceramic compositions having a specific composition, a ceramic composition wherein the crystal phase exists around MPB in a specific temperature range and phase-transits from MPB to tetragonal in a temperature range higher than the above specific temperature, has been found. When a piezoelectric element using such a ceramic composition is driven in the above specific temperature range, a dielectric constant and a displacement change very little even if the driving temperature becomes higher than the above specific temperature range. Accordingly, it has become possible to provide a piezoelectric element which can be driven in a wide temperature range without using such a specific driving device as mentioned above and a method for driving the same, thus the present invention has been achieved. The construction of the present invention is as follows.

(1) A piezoelectric element characterized by comprising a piezoelectric crystal which has a crystal structure around the crystal phase boundary of tetragonal and rhombohedral (MPB) in a specific temperature range and at least most of which phase-transits to tetragonal when heated to a temperature range higher than the above specific temperature range.

(2) A method for driving a piezoelectric element characterized by driving a piezoelectric element using a piezoelectric crystal which has a crystal structure around the crystal phase boundary of tetragonal and rhombohedral (MPB) in a specific temperature range and at least most of which phase-transits to tetragonal when heated to a temperature range higher than the above specific temperature range, in a temperature range not lower than the above specific temperature range.

(3) The method for driving a piezoelectric element according to the above (2), wherein the above temperature range for driving the piezoelectric element is from −50 to 200° C.

BRIEF EXPLANATION OF THE DRAWINGS

With regard to the piezoelectric crystal used in the method for driving the piezoelectric element of the present invention.

With regard to a piezoelectric crystal used in a conventional method for driving a piezoelectric element.

BEST MODE FOR CARRYING OUT THE INVENTION

A crystal system of a piezoelectric material used in a conventional method for driving changes little when temperature changes from room temperature to a higher temperature, as shown in the following FIG. 3a.

On the other hand, the piezoelectric crystal used in the method for driving the piezoelectric element in the present invention is around MPB of tetragonal/rhombohedral at a specific temperature, and the crystal phase changes to tetragonal when the temperature changes. By driving in a temperature range not lower than a temperature of MPB, i.e. by using the temperature of MPB as a minimum temperature of the driving temperature, the temperature dependency of the piezoelectric element can be suppressed low.

Figure 2A:
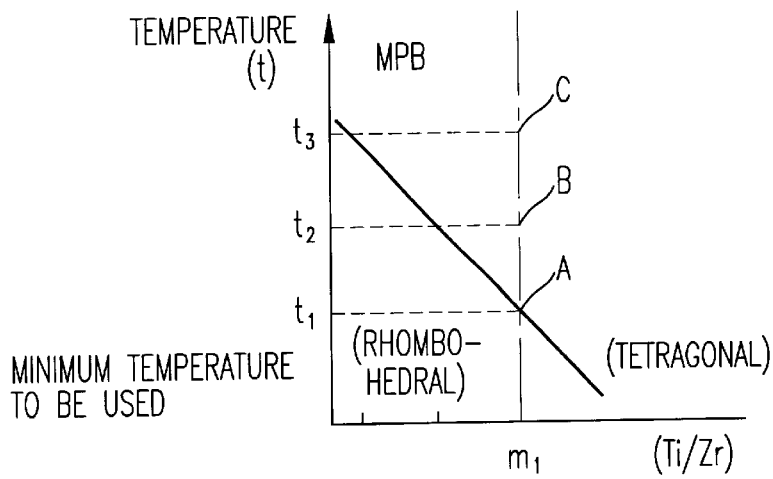
FIG. 2 shows a relation between temperature and crystal phase (2a), a relation between composition and displacement wherein temperature is a parameter (2b) and a relation between composition and dielectric constant wherein temperature is a parameter (2c).

FIG. 2 shows properties of the piezoelectric crystal in the following Example which phase-transits from MPB of tetragonal/rhombohedral to tetragonal, and FIG. 2a shows dependency of the temperature of MPB of the piezoelectric crystal on the composition (molar ratio of Ti/Zr). The composition $m_1$ was selected so as to provide the temperature of MPB, $t_1$ as a specific temperature, e.g. a minimum temperature to be used. This piezoelectric crystal is rhombohedral at a temperature lower than the temperature $t_1$ (A point in the figure), and on the contrary, as the temperature is raised to $t_2$ and $t_3(t_1<t_2<t_3)$, the crystal system phase-transits to tetragonal by moving to B point and C point in the figure.

Figure 2B:
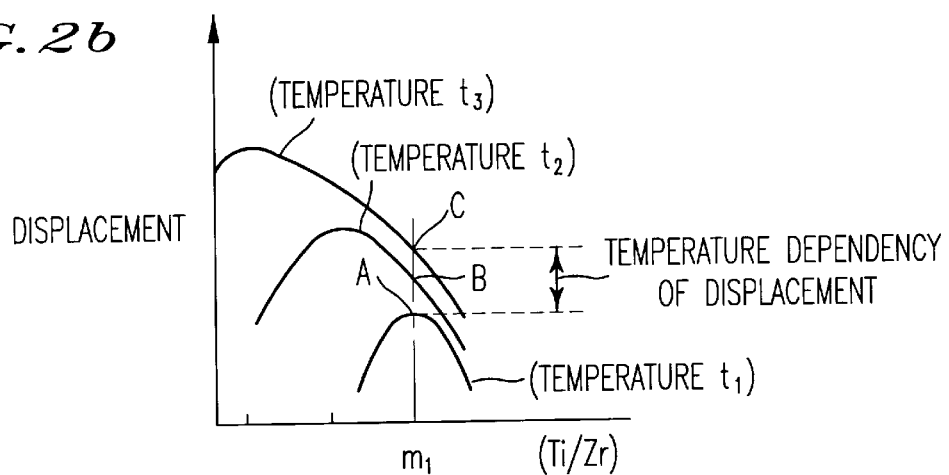
Figure 2C:
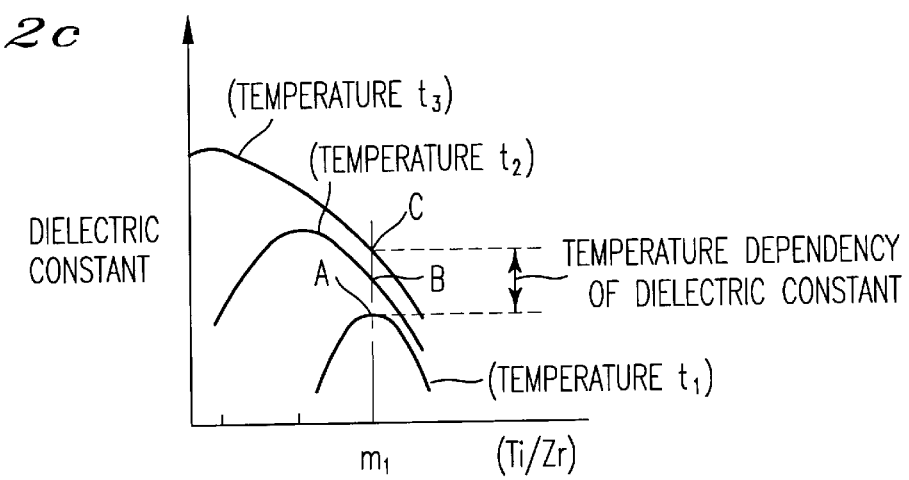

FIG. 2b and FIG. 2c show a relation between composition of the piezoelectric crystal in Example (molar ratio of Ti/Zr) and displacement and a relation between the composition and dielectric constant respectively.

As clear from FIG. 2b and FIG. 2c, each composition (molar ratio of Ti/Zr) of this piezoelectric crystal providing a maximum displacement and a maximum dielectric constant changes with temperature, and these maximum points shift to a composition having more Zr as the temperature is raised. The displacement and the dielectric constant of this piezoelectric crystal, for example, when the crystal system has the composition($m_1$) which indicates the state of MPB at the temperature $t_1$ (point A in each Figure) changes to point B and point C in each Figure as the temperature changes to $t_2$ and $t_3$ ($t_1<t_2<t_3$), and such changing amount of the displacement and the dielectric constant are small.

Figure 3A:
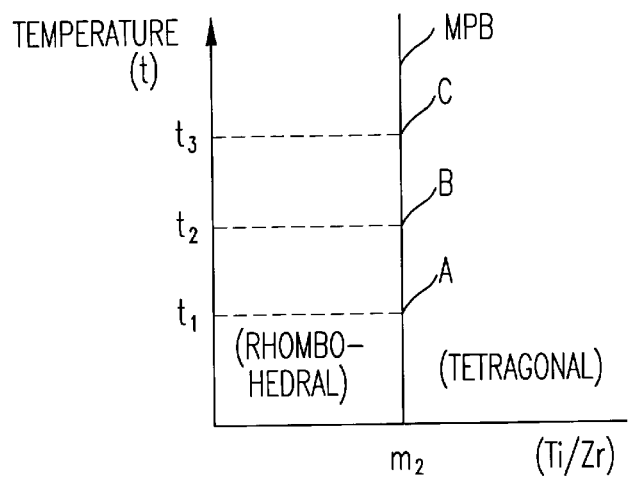
FIG. 3 shows a relation between temperature and crystal phase (3a), a relation between composition and displacement wherein temperature is a parameter (3b) and a relation between composition and dielectric constant wherein temperature is a parameter (3c).

On the other hand, FIG. 3 shows properties of the piezoelectric crystal in the following Comparative Example, and FIG. 3a clearly shows that the temperature which indicates the state of MPB of the piezoelectric crystal does not substantially change depending on the composition (molar ratio Ti/Zr). That is, the crystal system of the piezoelectric material having the specific composition ($m_2$) which indicates the state of MPB at the temperature $t_1$ (A point in Figure) does not change or changes negligibly when the temperature becomes lower or changes to $t_2$ and $t_3$ ($t_1<t_2<t_3$)(B point and C point in Figure).

Figure 3B:
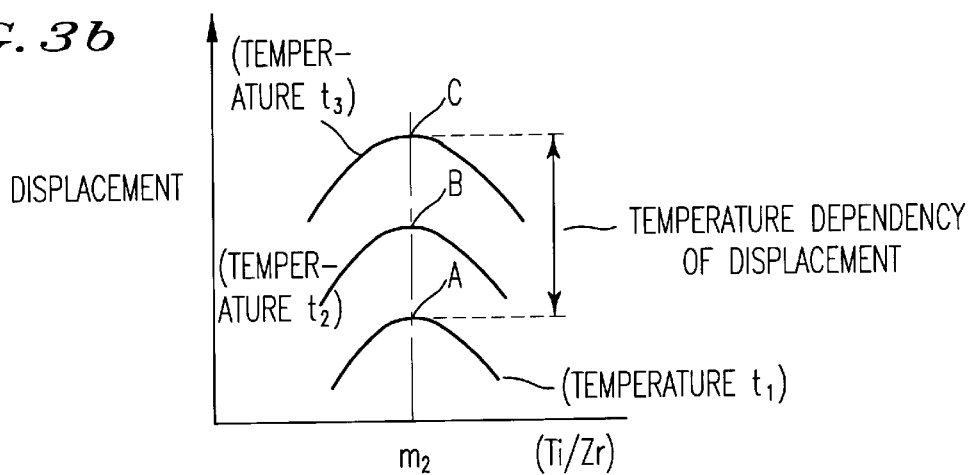
Figure 3C:
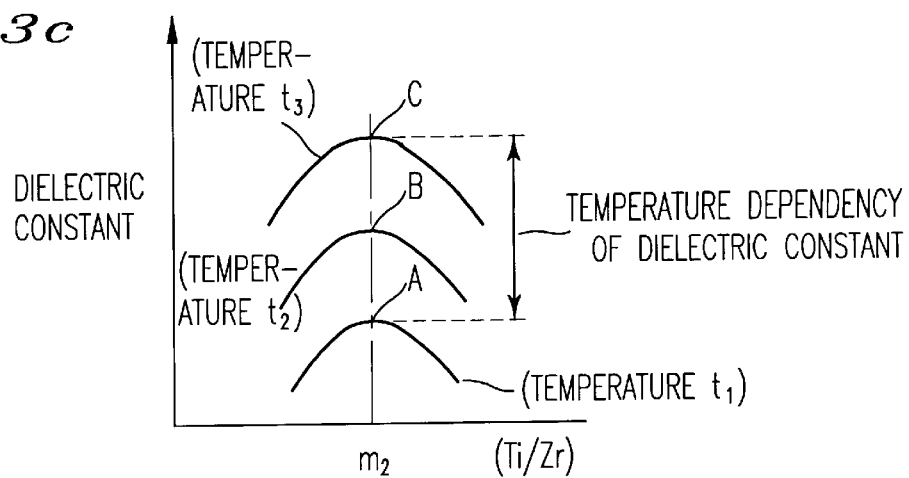

FIG. 3b and FIG. 3c show a relation between the composition of the above piezoelectric crystal in Comparative Example (molar ratio of Ti/Zr) and the displacement and a relation between the composition and the dielectric constant respectively.

As clear from FIG. 3b and FIG. 3c, the composition (molar ratio Ti/Zr) of this piezoelectric crystal which provides each a maximum displacement and a maximum dielectric constant, does not change when the temperature changes, and these maximum points do not shift when the temperature becomes higher. The displacement and the dielectric constant of this piezoelectric crystal, for example, when the crystal system has the composition ($m_2$) which indicates the state of MPB at the temperature $t_1$ (point A in each Figure), changes to point B and point C in each Figure as the temperature changes to $t_2$ and $t_3$ ($t_1<t_2<t_3$), but such changing amount is larger than those of the piezoelectric crystal of the present invention shown in FIG. 2b and FIG. 2c. Namely, the displacement and the dielectric constant largely depend on temperature.

Hereinafter, the method for driving the piezoelectric element of the present invention will be explained by using FIG. 2.

To drive a piezoelectric element by the driving method of the present invention, as mentioned above, a crystal structure of which is at A point in FIG. 2a at a specific temperature, namely, a crystal which is around the phase boundary of rhombohedral/tetragonal (MPB) at the temperature $t_1$ and phase-transits to tetragonal at a higher temperature, is selected. In this case, the minimum temperature $t_1$ for driving a piezoelectric element (minimum temperature under circumstances to be used) is estimated, and a crystal which is around MPB of tetragonal/rhombohedral at the minimum temperature $t_1$, is used for the piezoelectric element. Accordingly, at the temperature, the displacement properties and the dielectric constant of the piezoelectric element provide maximum values.

With regard to the piezoelectric element of the present invention, the piezoelectric crystal in FIG. 2a moves from A point corresponding to the above minimum temperature to B point and C point as the temperature becomes higher, and phase-transits to tetragonal. When driving the piezoelectric element, the crystal structure phase-transits from around MPB of tetragonal/rhombohedral to tetragonal as the temperature becomes higher (FIG. 2a). As clear from FIG. 2b, as it goes further from MPB, it goes further from the maximum point of the displacement, and the displacement amount of the piezoelectric element is suppressed in spite of the rising temperature. Accordingly, the temperature dependency of the displacement can be remarkably decreased. As a result, an identical piezoelectric element which can show an almost constant displacement by applying a constant voltage, can be provided.

On the other hand, when driving a piezoelectric element by a conventional method, a crystal wherein structure does not change when the temperature while driving changes, was used for the piezoelectric element. Accordingly, the piezoelectric properties provide maximum values around MPB, and the displacement amount remarkably changes together with the change of the temperature to be used. In this manner, a crystal generally becomes soft against an electric field when the temperature to be used becomes higher, and shows a large displacement amount. Namely, as shown in FIG. 3a, when MPB does not depend on temperatures or such a dependency is negligible and the crystal structure does not change, as shown in FIG. 3b, a displacement amount, largely changes depending on temperatures. This is considered to be a result of a mix action (synergistic action) of lowering of crystal elastic modulus and becoming for an atom itself to move against an electric field due to the rising temperature. However, this is not desired because MPB does not depend on temperature or such a dependency is very small so as not to have an effect on the properties (there in no effect of change of the crystal phase), and the temperature dependency of the displacement amount of the piezoelectric element becomes large.

Further, it is an important desired property that the dielectric constant of the piezoelectric element does not largely depend on temperature. Generally, it is known that a piezoelectric element provides a maximum value of the dielectric constant around MPB of the crystal phase at a specific temperature, and it is also known that the dielectric constant increases as the temperature becomes higher in the same way as the displacement. As clear from FIG. 3c, the dielectric constant of the conventional piezoelectric element the crystal phase of which does not substantially phase-transit, largely depends on temperature as mentioned above, but as clear from FIG. 2c, the temperature dependency of the dielectric constant of the piezoelectric crystal of the present invention is similar to the above displacement amount. Namely, since the crystal phase goes further from MPB as the temperature becomes higher, and therefore, the temperature dependency of the dielectric constant can be decreased.

With regard to the piezoelectric crystal of FIG. 2, the temperature dependency of the displacement amount and the dielectric constant can be remarkably decreased, the crystal phase-transits to tetragonal as the temperature becomes higher, and the lowering of electric coercive field of the crystal can be therefore suppressed. As a result, durability of the displacement property at a high temperature can be improved.

Figure 4:
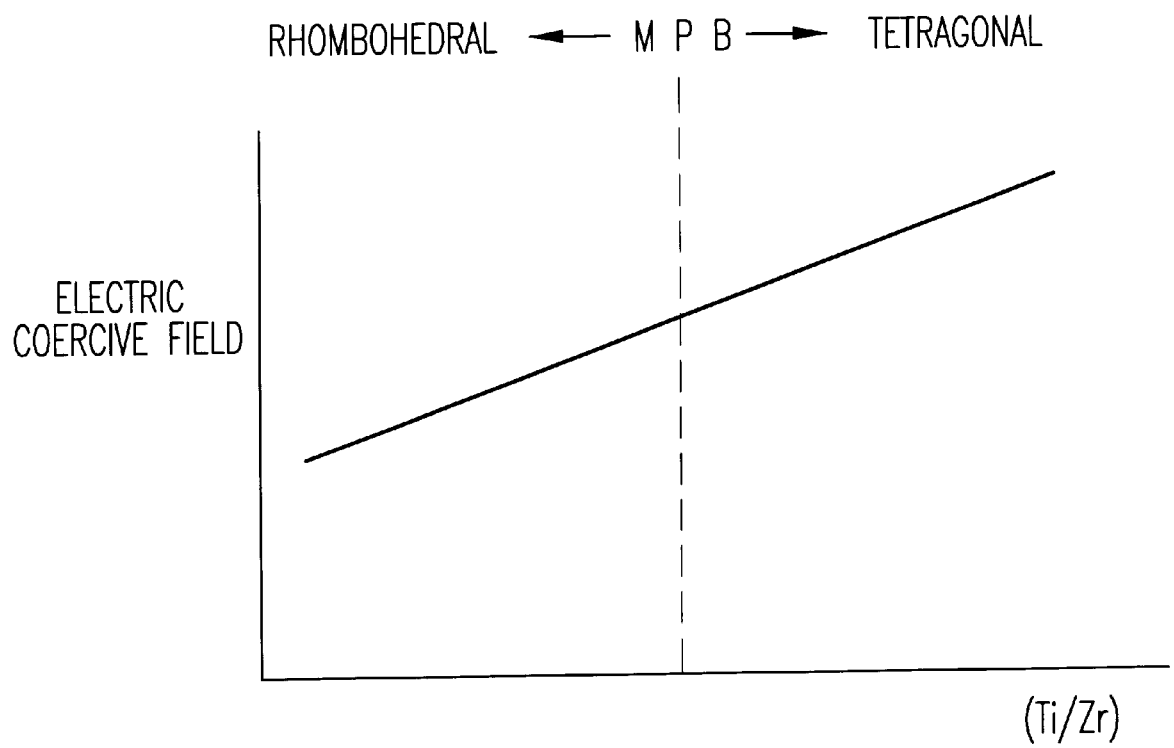
FIG. 4 shows a relation between composition and electric coercive field of the piezoelectric crystals of FIG. 2 and FIG. 3.

FIG. 4 illustrates a relation among a composition of a general PZT type piezoelectric crystal (Zr/Ti molar ratio), the electric coercive field and the crystal phase. As clear from FIG. 4, the electric coercive field of the piezoelectric crystal becomes larger as it goes to a tetragonal side (Ti rich side) through the MPB region, and the electric coercive field becomes smaller as it goes to a rhombohedral side (Zr rich side).

Figure 1:
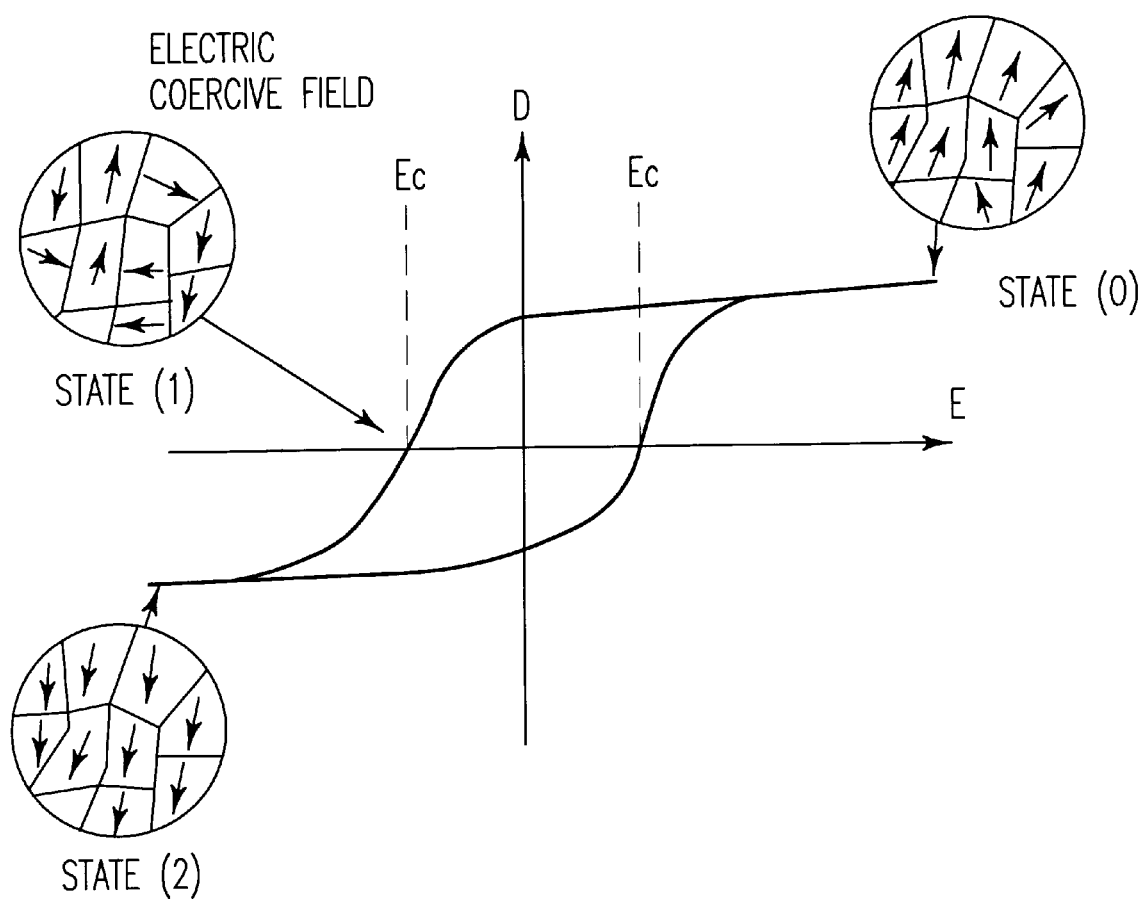
FIG. 1 explains electric coercive field which is a measure for easiness of changing a polarized state, and shows a relation between polarization of a piezoelectric material and electric field.

Generally, an electric coercive field of a crystal becomes smaller as the temperature becomes higher. When the electric coercive field becomes smaller, each particle polarized in a constant direction tends to be scattered in a piezoelectric crystal by a small change of an electric field as shown in FIG. 1, and durability of piezoelectric properties such as displacement is deteriorated. As illustrated in FIG. 3a, in case of a material wherein temperature dependency of crystal phase change (phase-transition) is small, such as the piezoelectric crystal used for the conventional driving method, a crystal around MPB does not phase-transit when the temperature to be used changes, and therefore, it becomes soft against an electric field as the temperature becomes higher, a polarized region easily moves, the electric coercive field becomes smaller, and the durability of the piezoelectric properties such as displacement tends to be deteriorated. Further, when driven by applying a voltage in a direction opposite to the polarization direction, it is undesirable because danger of depolarization increases.

On the other hand, the piezoelectric crystal used for the driving method of the present invention wherein the crystal phase goes to tetragonal when the temperature becomes higher (FIG. 2), phase-transits to tetragonal when the temperature becomes higher. Accordingly, the temperature dependency of the displacement or the dielectric constant can be suppressed, and the durability at a high temperature, more specifically, depolarization can be decreased compared with the conventional one which has a crystal system around MPB when used at a high temperature.

As the piezoelectric crystal used for the piezoelectric element of the present invention, the following compounds can be used.

A PZT type $ABO_3$ perovskite compound wherein a part of the A site is substituted with a divalent metal such as an alkaline earth metal or a trivalent metal such as La or Bi;

A PZT type $ABO_3$ perovskite compound wherein a part of the B site is substituted with at least one member selected from the group consisting of a tetravalent metal such as Sn, Si or Mn, a trivalent metal such as Al, Fe, In or Sb, a pentavalent metal such as Nb, Ta or Sb and hexavalent metal such as W; and A solid solution of the above PZT type piezoelectric material and a complex perovskite compound wherein the B site is on the average tetravalent, such as $Pb(Ni_{1/2}W_{1/2})O_3$, $Pb(Co_{1/3}Nb_{2/3})O_3$, $Pb(Ni_{1/3}Nb_{2/3})O_3$ or $Pb(Mg_{1/3}Nb_{2/3})O_3$.

Accordingly, a compound represented by the following general formula can be used for example.

$$Pb_{1-x-m}La_xA_m(Zr_yTi_{1-y})_{1-(x/4)}O_3$$

(A is at least one element selected from the group consisting of Sr, Ba and Ca. The blending amount of La, x, is $0 \leq x \leq 0.07$, preferably $0.0005 \leq x \leq 0.07$, more preferably $0.005 \leq x \leq 0.07$. The blending amount of Zr, y, $0.45 \leq y > 0.65$, preferably $0.47 \leq y \leq 0.63$. The blending amount of A element, m, is $0 \leq m \leq 0.15$, preferably $0.0005 \leq m \leq 0.10$, more preferably $0.005 \leq m \leq 0.10$.

To the above $Pb_{1-x-m}La_x(Zr_yTi_{1-y})_{1-(x/4)}O_3$, if necessary, at least one element selected from the group consisting of Sb, Nb and Ta can be solid-solubilized to be used, and its total amount calculated in terms of an oxide is from 0.005 to 3% by weight, preferably from 0.05 to 3% by weight.

Further, with regard to the above piezoelectric material, to the above oxide solid solution composition, if necessary, at least one element selected from the group consisting of In, Te, Ce and W can be blended, and its total amount calculated in terms of an oxide is from 0.005 to 0.5% by weight, preferably from 0.025 to 0.5% by weight.

Further, with regard to the above piezoelectric material, to the above oxide solid solution composition, at least one element selected from the group consisting of In, Te and Ce and at least one element selected from the group consisting of Al, Si, Fe and V can be blended at the same time. The total amount calculated in terms of an oxide of at least one member selected from the group consisting of In, Te, Ce and W is from 0.005 to 0.5% by weight, preferably from 0.025 to 0.5% by weight. The total amount calculated in terms of an oxide of at least one member selected from the group consisting of Al, Si, Fe and V is from 0.005 to 0.2% by weight, preferably from 0.025 to 0.2% by weight.

A piezoelectric ceramic composition suitable for the present invention is not limited to the above compositions. Among the above compositions and others, a crystal wherein the crystal structure is around the crystal phase boundary of tetragonal and rhombohedral (MPB) in a specific temperature range and a whole part or an almost whole part of the crystal phase-transits from MPB to tetragonal at a temperature higher than such a temperature range, is selected to be used for a piezoelectric element.

Such a piezoelectric ceramic composition can be obtained by weighing its starting material so as to stoichiometricly provide a blending composition represented by the above general formula, wet-mixing it by a ballmill or the like, pulverizing it after provisional calcination, and calcining at from 1100 to 1300° C. the powders thus obtained to be sintered.

It is not always necessary that the starting material of the piezoelectric ceramic composition of the present invention is an oxide, and a compound which can easily change to an oxide at a high temperature, such as a hydroxide, a chloride, a sulfate, a nitrate or the like of each element, can be used similarly.

EXAMPLE

The Pb position of the A site of a PLZT crystal having an $ABO_3$ type perovskite structure was substituted with 0.05 mol % of La, 2 mol % of Sr, 4 mol % of Ba and 4 mol % of Ca, and the Ti position of the B site was substituted with 1 mol % of Nb to provide Zr/Ti(molar ratio) of 55.5/44.5. Further, to this perovskite mol % of Ca, and the Ti position of the B site was substituted with 1 mol % of Nb to provide Zr/Ti(molar ratio) of 55.5/44.5. Further, to this perovskite composition, Fe was added in an amount of 0.05% by weight calculated in terms of $Fe_2O_3$, and In was added in an amount of 0.03% by weight calculated in terms of $In_2O_3$ to obtain a piezoelectric material. The piezoelectric material thus obtained was mix-pulverized by a ballmill, was sintered at 1200° C., and was polished. Thereafter, plural disks of the piezoelectric material having a ø of 15 mm and a thickness of 0.5 mm, were prepared.

Figure 5A:
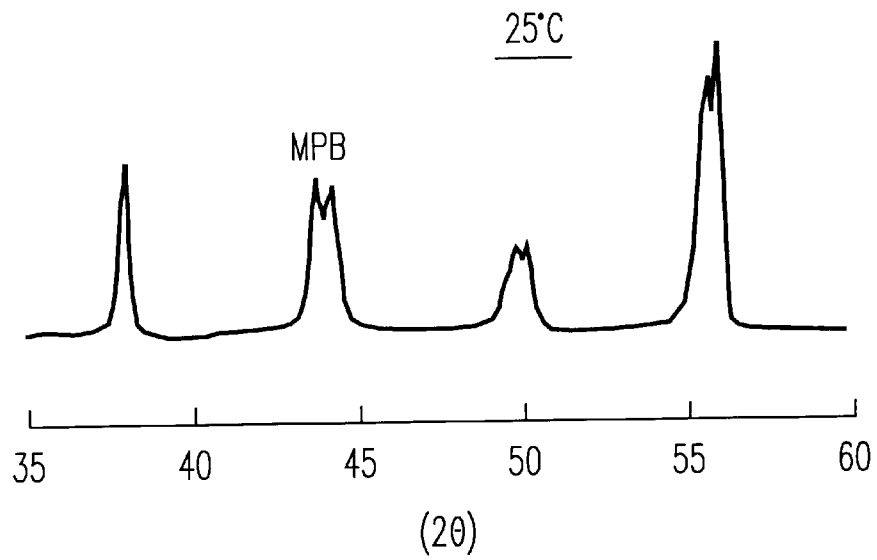
FIG. 5 shows X-ray diffraction patterns at 25° C. and 150° C. of the piezoelectric crystal in Example.
Figure 5B:
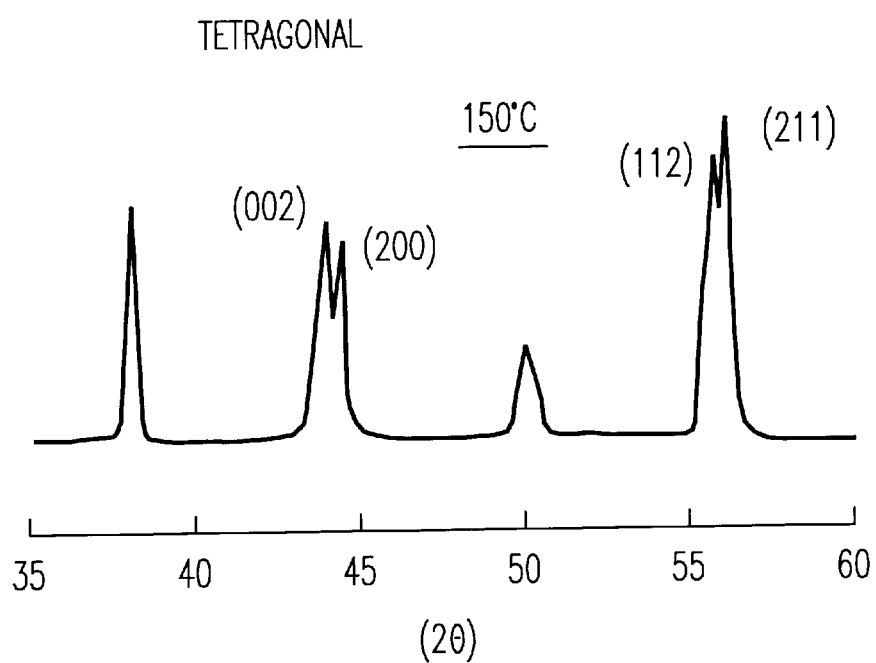

Then, these disks were polished, and were annealed at 500° C. to remove polishing strain. Thereafter, in accordance with a high temperature X-ray diffraction method, the crystal phase was measured at each temperature of 25° C., 100° C. and 150° C. Thereamong, X-ray diffraction patterns measured at 25° C. and 150° C. are shown in FIG. 5.

The crystal phase of the piezoelectric material thus obtained was around the phase boundary of tetragonal and rhombohedral (MPB) at 25° C. (see FIG. 2a), and it became tetragonal as the temperature became higher (shown by the peak shape around 2θ=43–45° in the X-ray diffraction pattern of FIG. 5b). That is, this shows the phase-trasition of FIG. 2a.

With regard to Curie temperature of the piezoelectric material obtained, temperature dependency of dielectric material obtained, temperature dependency of dielectric constant was measured at the frequency 1KHz, and from these data, a temperature which indicates a maximum dielectric constant was searched for to obtain Curie temperature. As a result, the Curie temperature Tc was 260° C.

Figure 7A:
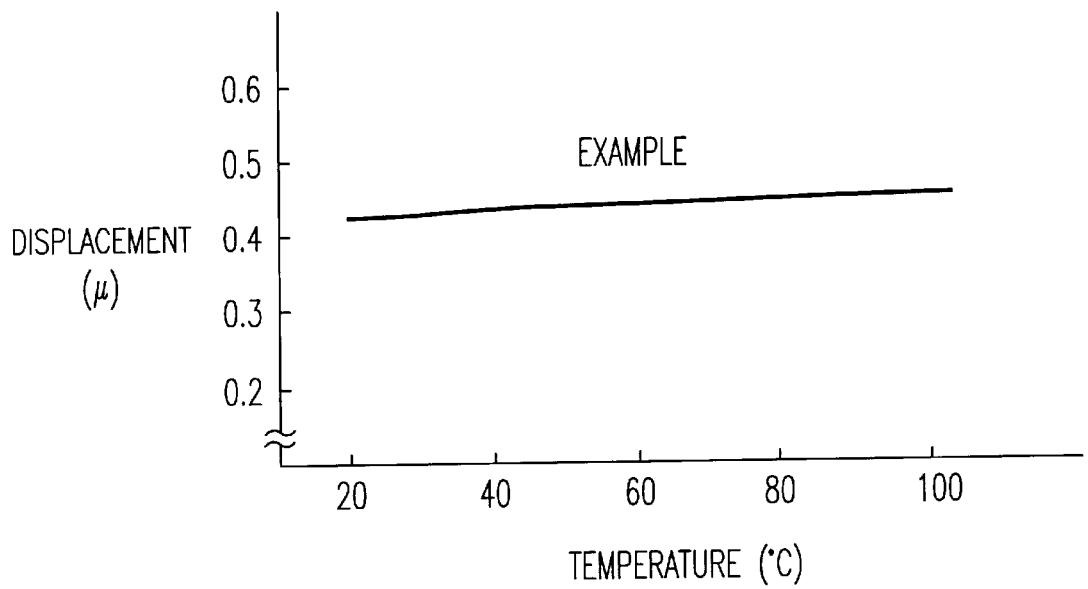
FIG. 7 shows temperature dependency of displacement with regard to the piezoelectric materials in Example and Comparative Example.
Figure 8A:
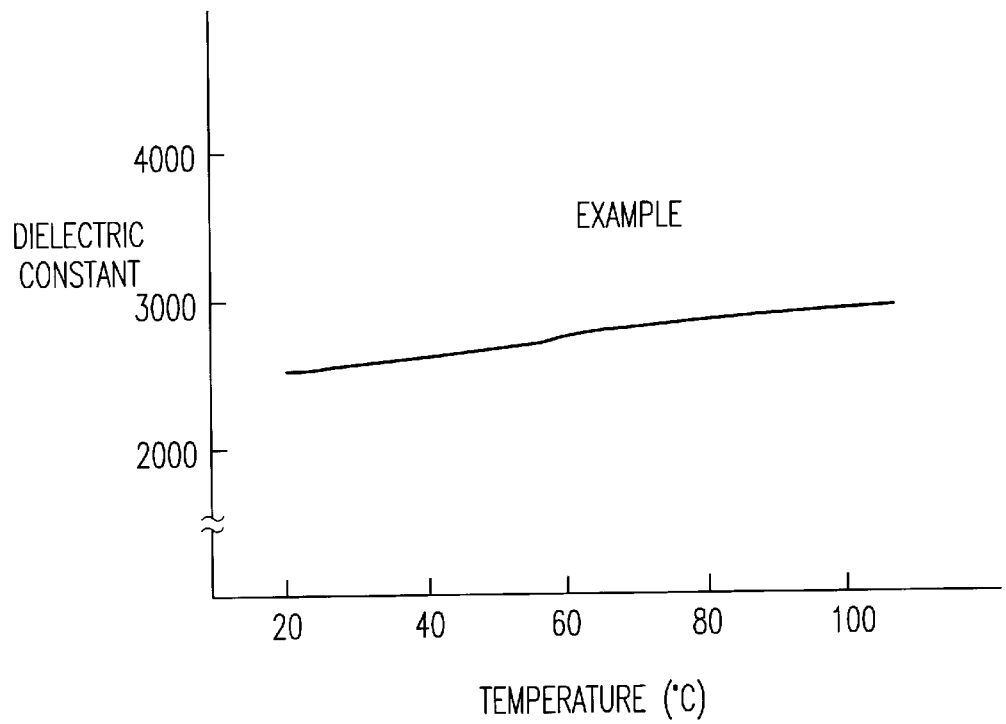
FIG. 8 shows temperature dependency of dielectric constant with regard to the piezoelectric materials in Example and Comparative Example.

On this disk, an Ag electrode was printed in accordance with a screen printing method, and was calcined at 550° C. Thereafter, polarization was carried out by applying a direct current voltage of 3 KV/mm for 10 minutes in a temperature range of from 70 to 140° C. A temperature dependency of a displacement in a direction of the thickness of the piezoelectric element thus obtained, was measured at 0.1 Hz at from 20 to 100° C. by applying voltages of positive and negative 280V, which is shown in FIG. 7a. Also, temperature dependency of dielectric constant was measured at 1 kHz at from 20 to 100° C., which is shown in FIG. 8a.

COMPARATIVE EXAMPLE

A piezoelectric material wherein the Pb position of the A site of a PLZT crystal having an $ABO_3$ type perovskite structure was substituted with 5 mol % of La and Zr/Ti was 56.5/42.5, was sintered in the same manner as in Example to prepare plural disks of the piezoelectric material.

Figure 6A:
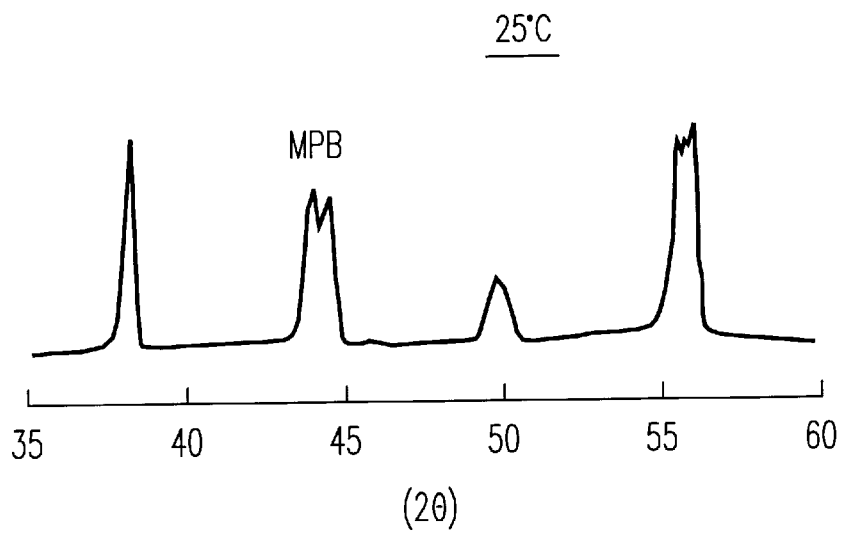
FIG. 6 shows X-ray diffraction patterns at 25° C. and 150° C. of the piezoelectric crystal in Comparative Example.
Figure 6B:
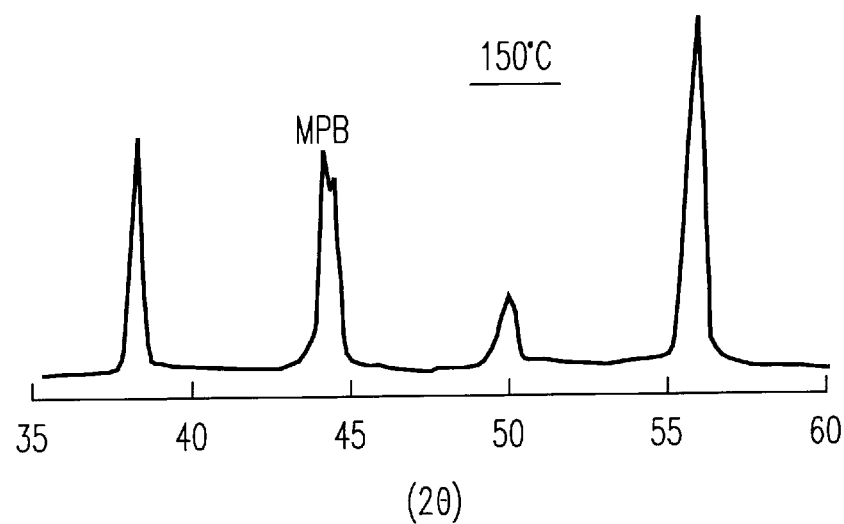

A change of a crystal phase of the piezoelectric material thus obtained was measured in the same manner as the piezoelectric material in example. Thereamong, X-ray diffraction patterns at 25° C. and 150° C. are shown in FIG. 6. The crystal phase was around MPB of tetragonal and rhombohedral at 25° C. (see FIG. 6a), and it did not substantially phase-transit from MPB to tetragonal even though raising the temperature was raised (see FIG. 6b). That is, this corresponds to the case of FIG. 3a.

Figure 7B:
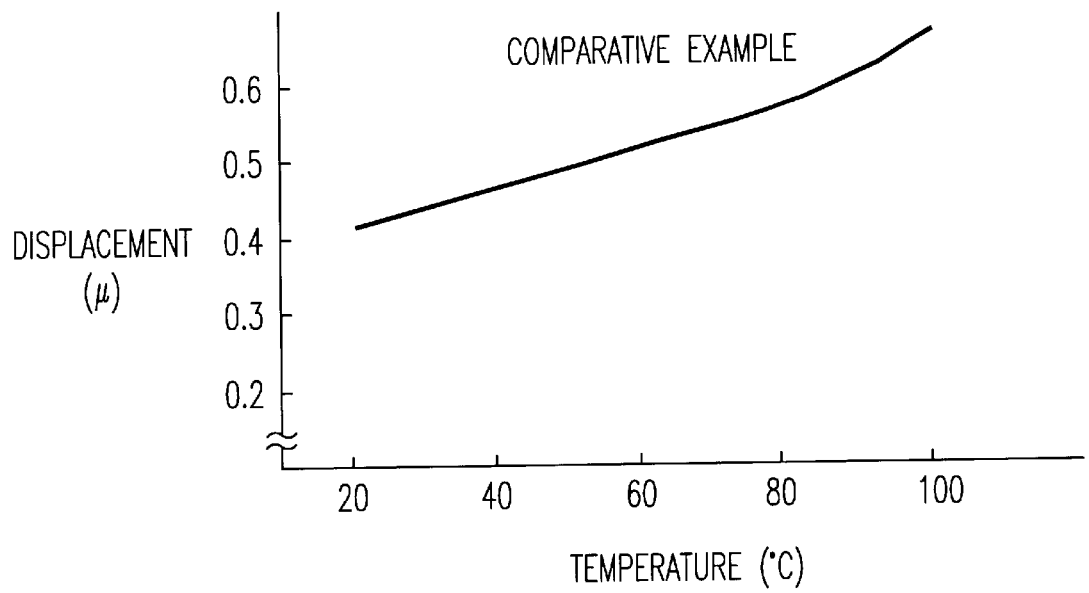

To evaluate electric properties, a depolarization treatment was carried out to this disk in the same manner as in Example to obtain a piezoelectric element. Curie temperature of this material was measured in the same manner, and Tc was 258° C. Temperature dependency of a displacement in a direction of the thickness of the piezoelectric element thus obtained, was measured at 0.1 Hz at from 20 to 100° C. by applying voltages of positive and negative 280V similarly, which is shown in FIG. 7b as Comparative Example.

Evaluation of Temperature Dependency of Displacement and Dielectric Constant

The piezoelectric material of Example showed phase-transition from MPB to tetragonal when raising the temperature, while phase-transition of the piezoelectric material of Comparative Example was not substantially observed.

The piezoelectric material of Example showed a crystal change shown in FIG. 2a, and the crystal phase went further from the MPB range providing a maximum displacement value when raising the temperature (see FIG. 2b). Thereby, as shown in FIG. 7a, an increase of displacement (strain) of the piezoelectric material caused by inducing an electric field was suppressed. Accordingly, compared with the displacement amount of the piezoelectric material of Comparative Example (FIG. 7b), the temperature dependency was remarkably decreased, and a state wherein it hardly depends on temperatures, was realized.

Figure 8B:
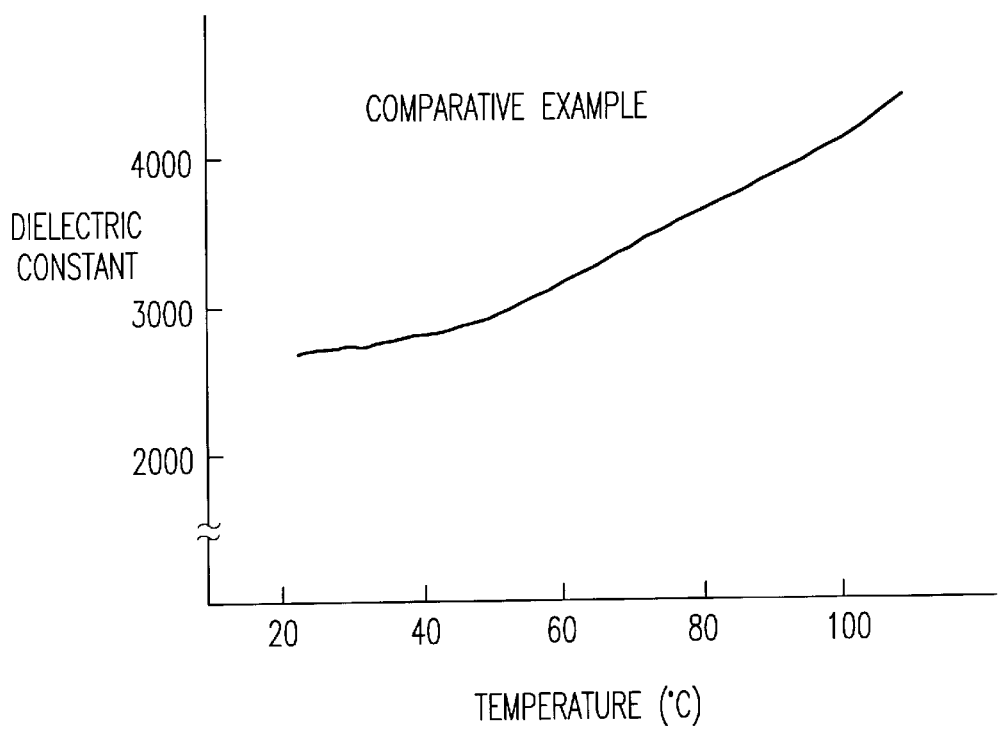

FIG. 8 shows temperature dependency of each dielectric constant of the piezoelectric materials of Example and Comparative Example. As explained in FIG. 2c, the piezoelectric material of Example went further from the range of MPB providing a maximum dielectric constant value when raising the temperature. Thereby, an increase of the dielectric constant was suppressed, and the temperature dependency of the dielectric constant was remarkably decreased.

Evaluation of Electric Coercive Field and High Temperature Durability

With regard to the piezoelectric materials of Example and Comparative Example, electric coercive field was measured and durability at a high temperature was examined. The electric coercive field was measured by applying a voltage of from −400 to 400V at 100° C. at 1 Hz to an element having a thickness of 0.5 mm.

The evaluation of durability at a high temperature was carried out as followed. To an element having a thickness of 0.5 mm, voltages of positive and negative 280V were applied at room temperature at 0.1 Hz to measure a displacement amount. Thereafter, it was continuously driven for 2000 hours at 80° C. at 50 Hz at AC200V, and then, the temperature was lowered back to room temperature and the same voltages of positive and negative 280V were applied at 0.1 Hz to measure a displacement amount.

The results are shown in Table 1.

When electric coercive fields at 100° C. of the piezoelectric materials of Example and Comparative Example were measured, the electric coercive field of the piezoelectric material of Example was larger than that of Comparative Example although these piezoelectric material had almost the same Curie temperature. This matter and the small temperature dependency of dielectric constant show that the piezoelectric material of Example is excellent in durability at a high temperature. Specifically, a deterioration ratio of Example is as small as 2%, while a deterioration ratio of Comparative Example is 52%. That is, it only indicates a displacement not larger than the half, which shows a remarkable improvement of durability at a high temperature.

TABLE 1

|  | Example | Comparative Example |
| --- | --- | --- |
| 100 v electric coercive field | 770 v/mm | 610 v/mm |
| Deterioration ratio after driving continuously for 2000 hours at 80° C. at AC200V | 2% | 52% |

INDUSTRIAL FIELD OF UTILIZATION

In the present invention, a piezoelectric element the crystal structure of which is around the crystal phase boundary of tetragonal and rhombohedral (MPB) in a specific temperature range and can phase-transit to tetragonal at a temperature higher than the specific temperature range, is used. By driving it in a temperature range the minimum temperature range of which is a temperature range wherein the piezoelectric crystal has a crystal structure around MPB, temperature dependencies of piezoelectric properties such as dielectric constant of the piezoelectric element and strain by inducing an electric field could be remarkably decreased. Further, decrease of electric coercive field of the piezoelectric element at a high temperature was suppressed, and durability of the piezoelectric element when used at a high temperature could be improved. Therefore, it is possible to obtain a desired displacement stably in a wide temperature range to be used without using an expensive and complicated circuit for adjusting a voltage. Accordingly, the present invention is remarkably useful industrially.

We claim:

1. A piezoelectric element comprising a piezoelectric crystal having a crystal structure that changes upon heating from a rhombohedral structure to a tetragonal structure at only one phase transition temperature, wherein
the piezoelectric crystal is a lead zirconate titanate compound comprising at least one element selected from a group consisting of alkaline earth metals, La and Bi.

2. A method of using a piezoelectric element, the method comprising
driving a piezoelectric element including a piezoelectric crystal, wherein
the piezoelectric crystal has a crystal structure that changes upon heating from a rhombohedral structure to a tetragonal structure at only one phase transition temperature;
the piezoelectric crystal is a lead zirconate titanate compound comprising at least one element selected from a group consisting of alkaline earth metals, La and Bi; and
the piezoelectric element is driven in a temperature range not lower than the only one phase transition temperature.

3. The method according to claim 2, wherein the piezoelectric element is driven in an temperature range from −50° C. to 200° C.

4. The piezoelectric element according to claim 1, wherein the piezoelectric crystal further comprises at least one element selected from a group consisting of Sn, Si, Mn, Al, Fe, In, Sb, Nb, Ta, and W.

5. The piezoelectric element according to claim 1, wherein the piezoelectric crystal further comprises at least one element selected from a group consisting of Ni, W, Co, Nb and Mg.

6. The piezoelectric element according to claim 1, wherein
the piezoelectric crystal has a composition defined by $$Pb_{1-x-m}La_xA_m(Zr_yTi_{1-y})_{1-(x/4)}O_3;$$

A is at least one element selected from a group consisting of Sr, Ba and Ca; $0.0005 \leq x \leq 0.07$; $0.45 \leq y \leq 0.65$; and $0.0005 \leq m \leq 0.15$.

7. The piezoelectric element according to claim 6, further comprising at least one element selected from a group consisting of Sb, Nb and Ta.

8. The piezoelectric element according to claim 7, further comprising at least one element selected from a group consisting of In, Te, Ce, W, Al, Si, Fe and V.

* * * * *